(12) United States Patent
Muething, Jr. et al.

(10) Patent No.: US 6,469,493 B1
(45) Date of Patent: *Oct. 22, 2002

(54) LOW COST CMOS TESTER WITH EDGE RATE COMPENSATION

(75) Inventors: Gerald F. Muething, Jr., Pleasanton, CA (US); George W. Conner, Thousand Oaks, CA (US)

(73) Assignee: Teradyne, Inc., Boston, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 840 days.

(21) Appl. No.: 08/510,079

(22) Filed: Aug. 1, 1995

(51) Int. Cl.⁷ .............................................. G01R 15/12
(52) U.S. Cl. ..................... 324/158.1; 324/765; 324/763
(58) Field of Search ................................ 324/763, 73.1, 324/158.1, 765, 760; 327/108, 378, 512, 513; 326/32, 68; 371/25.1, 15.1; 714/700, 733, 734

(56) References Cited

U.S. PATENT DOCUMENTS

| | | | |
|---|---|---|---|
| 3,970,875 A | 7/1976 | Leehan | 307/304 |
| 3,996,481 A | 12/1976 | Chu et al. | 307/262 |
| 4,473,762 A | 9/1984 | Iwahashi et al. | 307/594 |
| 4,497,056 A | * 1/1985 | Sugamori | 371/25.1 |
| 4,513,427 A | 4/1985 | Borriello et al. | 375/110 |
| 4,514,647 A | 4/1985 | Shoji | 307/269 |
| 4,527,126 A | 7/1985 | Petrich et al. | 328/155 |
| 4,549,818 A | 10/1985 | Nishikubo et al. | 374/178 |
| 4,584,695 A | 4/1986 | Wong et al. | 375/81 |
| 4,641,048 A | 2/1987 | Pollock | 307/591 |
| 4,724,378 A | 2/1988 | Murray et al. | 324/73 |

(List continued on next page.)

FOREIGN PATENT DOCUMENTS

| | | |
|---|---|---|
| EP | 254017 | 1/1988 |
| JP | 14622/1983 | 1/1983 |

OTHER PUBLICATIONS

A Low–Cost High–Performance CMOS Timing Vernier for ATE, Chapman et al. IEEE International Test Concerence 1995 (No month available).

Integrated Pin Electronics for a VLSI Test System, Branson et al. IEEE International Test Conference 1988 (No month available).

(List continued on next page.)

*Primary Examiner*—Vinh P. Nguyen
(74) *Attorney, Agent, or Firm*—Lance Kreisman (57) ABSTRACT

Automatic test equipment implemented with low cost CMOS components. Despite the use of CMOS circuitry, which generally has poor timing accuracy, the disclosed test equipment achieves good timing accuracy through the use of several techniques. A delay locked loop is used to compensate for timing variations caused by process variation and slowly varying changes in operating temperature. A frequency dependent heating element is used to avoid temperature induced changes in propagation delays caused by rapid variations in the heat generated by the CMOS circuitry when the operating frequency changes. The design also reduces the number of circuit elements in the critical timing paths which process signals which vary with programmed frequency. To achieve this goal, a continuously running, fixed frequency reference clock is delayed by a fractional amount of one clock period. A counter, also clocked at the reference clock frequency, counts full clock periods. The number of full clock periods as well as the amount of fractional delay is programmed. When the required number of full clock periods has elapsed, the next pulse of the fractionally delayed clock signal is gated to the output of the timing generator as an edge signal with the programmed interval between pulses.

25 Claims, 7 Drawing Sheets

U.S. PATENT DOCUMENTS

| | | | |
|---|---|---|---|
| 4,894,561 A | | 1/1990 | Nogami ...................... 307/443 |
| 4,902,986 A | | 2/1990 | Lesmeister .................... 331/25 |
| 4,980,586 A | | 12/1990 | Sulivan et al. ............... 307/591 |
| 5,097,208 A | * | 3/1992 | Chiang ....................... 324/73.1 |
| 5,099,196 A | * | 3/1992 | Longwell et al. .......... 324/73.1 |
| 5,136,182 A | | 8/1992 | Fawal ...................... 307/296.8 |
| 5,214,680 A | | 5/1993 | Gutierrez et al. ............. 377/20 |
| 5,225,775 A | * | 7/1993 | Sekino ..................... 324/158.1 |
| 5,256,964 A | * | 10/1993 | Ahmed et al. ........... 324/158.1 |
| 5,283,631 A | | 2/1994 | Koerner et al. ............. 307/451 |
| 5,336,940 A | * | 8/1994 | Sorrells et al. ............. 327/276 |
| 5,345,186 A | * | 9/1994 | Lesmeister .................. 307/105 |
| 5,359,303 A | | 10/1994 | Mirow ....................... 331/176 |
| 5,365,130 A | * | 11/1994 | Murray et al. ............... 327/278 |
| 5,376,846 A | | 12/1994 | Houston ..................... 327/513 |
| 5,428,626 A | * | 6/1995 | Frisch et al. ............. 324/158.1 |
| 5,438,259 A | * | 8/1995 | Orihashi et al. ......... 324/158.1 |

OTHER PUBLICATIONS

Integrated Pin Electronics for Automatic Test Equipment, Grace et al. Hewlett–Packard Journal 1994 (No month available).

Internal Oscillator Ring, Heuer et al. IBM Technical Disclosure Bulletin 1977.

High–Performance CMOS–Based VLSI Testers: Timing Control and Compensation, Chapman IEEE International Test Conference 1992 Compensation, Chapman IEEE International Test Conference 1992 (No month available).

Design of PLL–Based Clock Generation Circuits, IEEE Journal of Solid–State Circuits vol. sc–22 No. 2 1987 (No month available).

* cited by examiner

LOW COST CMOS TESTER WITH EDGE RATE COMPENSATION

This invention relates generally to automatic test equipment and more specifically to low cost automatic test equipment for semiconductor devices.

Semiconductor devices, such as memory chips and micro controllers, are usually tested at least once during their manufacture. Testing is conventionally performed with automated equipment called a "tester." A tester is a computer controlled device with many input/output points. Each of the input/output points is connected to one lead of the semiconductor device through a device called a prober or a handler.

So that one tester can be used to test many different types of semiconductor devices, the tester can be programmed to generate "patterns." The pattern defines what stimuli are applied to the device under test and the expected responses to that stimuli. Defective devices are detected because they do not produce the expected responses.

To make a tester which is the most useful, it is desired that the tester be able to apply or check for any value at any time at any pin of the device being tested. Typically, a pattern is made up of a string of vectors. Each vector contains information about the values to be applied to or expected to be detected at each pin of the device under test during one period of the tester's operation. This information includes the data value, timing information and format information.

Format information indicates at a minimum whether the data is a value which should be driven or is a value expected to be observed at the pin. In some testers, format information also indicates the format which a valid logic 1 or 0 should take. Examples of formats are return-to-zero, nonreturn-to-zero and surround by complement.

Most testers allow the length of a period to be programmed. The period is generally the same for signals applied to all pins in the tester. The timing information is programmed as a delay relative to the start of the period.

To provide the required flexibility, a typical tester has an architecture with some centralized control, or "global," control circuitry. In addition, there are multiple identical circuits called "channel electronics" or more simply "channels." Each channel provides the signals for one pin of the device under test.

Figure 1:
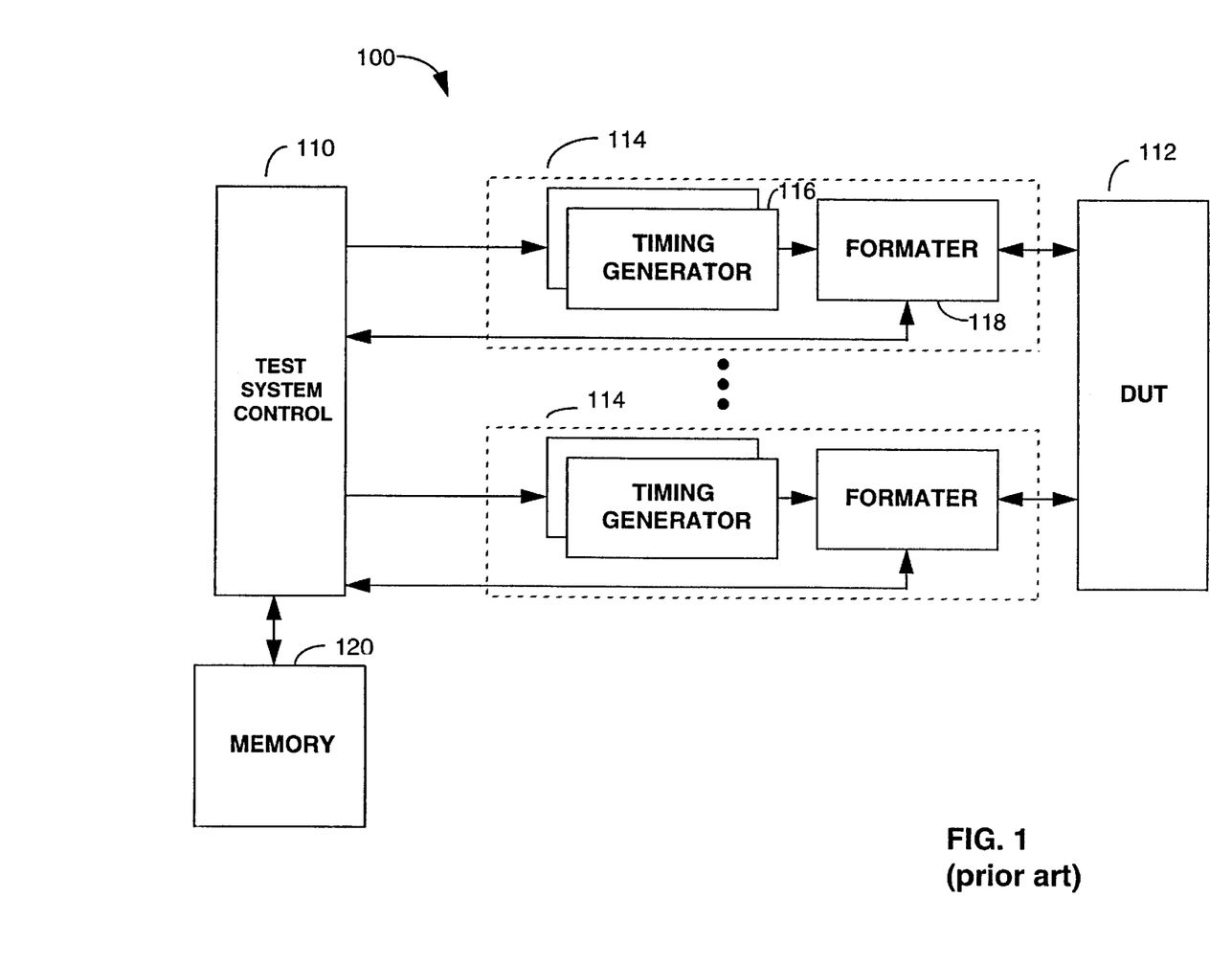
FIG. 1 is a block diagram of a prior art tester.

FIG. 1 shows a typical prior art tester 100. A test pattern is stored in memory 120. For each cycle of tester operation, test system control 110 reads one vector from memory 120. Then, the data, format and timing information are provided to a plurality of channels 114. In addition, test system control 110 provides a timing signal to each of the channels which defines a reference time from which all delays are calculated. This is sometimes called the "beginning of period" signal or "period clock".

Each channel 114 contains several timing generators 114. Each timing generator produces a timing signal, sometimes called an "edge," a programmed time after the beginning of period signal. There are multiple timing generators 116 because each is dedicated to perform a specific function. For example, one timing generator is dedicated to turning on the drive voltage and one is dedicated to turning off the drive voltage. Another is dedicated to starting a comparison operation while another to stopping the comparison operation.

The edges from all of the timing generators 116 are passed to formatter 118. Formatters 118 contain the drivers and comparators which actually provide or measure the data. The time when each operates is controlled by the edge signals. In this way, signals are driven to or measured at the device under test 112.

For a tester which can test even a modestly complicated part, there will be more than fifty and likely more than one hundred channels 114. The channel circuitry, thus, accounts for a large portion of the cost of tester 100. The cost can be particularly high because low cost technologies, such as CMOS, are not suitable for the channel circuitry in many testers. Rather, ECL components are widely used because they can operate at high clock rates and are very stable.

CMOS circuitry made using widely available 0.8 micron processes has a maximum operating frequency of approximately 100 MHz. Components made with state of the art 0.3 micron processes can extend the operating frequency to as much as 200 MHz. This means that the clock likely has a resolution of only 10 nsec, and in the best case a resolution of 5 nsec. When CMOS digital signals are synchronized relative to the clock, they have a resolution of only 5 to 10 nsec. Often, a resolution less than 250 psec resolution is required for a tester. Further, programmed values should be very accurate.

To provide finer resolution, the delay is broken into two pieces: the integer number of clock periods plus some fractional portion of a clock signal. A counter produces an output pulse after the required integer number of clock periods. The fractional part of the delay is provided by delaying this pulse in either a programmable delay line or analog circuitry called a timing "interpolator" or "vernier." Timing generation circuitry of this type is described in U.S. Pat. No. 4,231,104 to St. Clair and U.S. Pat. No. 5,274,796 to Conner.

The difficulty with using CMOS for such an arrangement is that the delay of CMOS circuits varies as a function of temperature of the devices. The delay of a CMOS circuit changes approximately 0.3%/° C. to 0.4%/° C. Such a large change as a function temperature means that the same delay programmed into a channel will produce different results when operated at different temperatures. In addition, CMOS components have large part-to-part variations. Delays through parts which have been identically processed can vary by as much as 20 or 30%.

One simple approach is to calibrate the tester each time the operating temperature changes significantly. Many calibration techniques are known. U.S. Pat. No. 4,724,378 to Murray et al. describes an external calibration device used to compute timing correction values which are stored in the tester memory. Other techniques are known for deriving the calibration values, including the addition of circuitry to the tester to derive the calibration values. However, the process of calibrating the tester can be very time consuming.

Mechanical solutions to keep the CMOS chips at uniform temperatures are possible. However, requiring cooling components is expensive and defeats the purpose of using CMOS to provide a low cost tester. It also does not eliminate the delay differences caused by part-to-part variations.

An alternative way to compensate for differential delays is to heat the CMOS chips. U.S. Pat. No. 4,980,586 to Sullivan et al, uses circuitry on the chip to heat the CMOS chip to the desired operating temperature. In addition, that patent describes a feed back mechanism in which a ring oscillator on the chip is used as part of circuit to measure actual delays. The frequency of the signal in the ring oscillator is inversely proportional to the delay. A control signal is derived from the frequency of oscillation in the ring oscillator and then used to adjust the amount of heat generated by the heating circuit.

While such an approach can compensate for temperature as well as part-to-part variation, it requires that the CMOS chip run at an elevated temperature. Operation in this condition can lead to reliability problems and also requires greater power consumption.

A similar solution is described in U.S. Pat. Nos. 4,902,986 and 5,345,186. In each of these patents, the ring oscillator is incorporated into a phased locked loop in which the frequency produced by the ring oscillator is compared to a stable reference frequency to produce a feedback signal. The feedback signal controls the supply voltages of the components in the ring oscillator. As the supply voltage is varied, the delay through the loop changes. In this way, the frequency of the signal in the ring oscillator is synchronized to the stable reference frequency. As a result, the delay through the delay chain is constant. The same supply voltage is used to provide power to other devices in time critical paths on the chip.

This technique eliminates the disadvantage of operating the CMOS part at an elevated temperature. However, it has the added disadvantage of requiring that different parts of the CMOS chip be connected to different supply voltages. Such an arrangement can be difficult to design and fabricate.

A very similar compensation technique is described in U.S. Pat. No. 4,641,048 to Pollock. However, that patent is not specifically limited to CMOS circuitry. Thus, that patent generally shows the control signal fed to a bias input of the components rather than being the supply voltage.

Also, the need to compensate for delay variations in CMOS components has been long known. Examples of various techniques are found in U.S. Pat. No. 3,970,875 to Leehan, U.S. Pat. No. 3,996,481 to Chu et al., U.S. Pat. No. 4,008,406 to Kawagoe, U.S. Pat. No. 4,346,343 to Berndlmaier et al., U.S. Pat. No. 4,473,762 to Iwahahi et al., U.S. Pat. No. 4,494,021 to Bell et al. and U.S. Pat. No. 4,514,647 to Shoji.

Each of these techniques can aid in making a precise and accurate CMOS tester. However, we have recognized that these techniques still yield testers which often have less than the desired accuracy in programming edges. In particular, we have recognized that these techniques are primarily useful in adjusting for variations in ambient temperature. They can not compensate well for the fact that the operating temperature of CMOS components changes as a function of operating frequency.

We have recognized that temperature changes due to changes in operating frequency pose a particular problem in the channel circuitry of a CMOS tester. In particular, a tester usually operates in a "burst mode." When a device to be tested is first connected to the tester, the channel circuitry is not generating signals. It is essentially operating at zero frequency and is generating very little heat. When a device is tested, the signals in the channel circuitry are being generated at a high frequency, typically 50 MHz to 100 MHz. However, a test of one device lasts only a matter of seconds. During that test or "burst," the CMOS parts in the tester heat up, resulting in a change in timing accuracy. After the burst, the CMOS parts start to cool down. Thus, during the entire burst, the temperature of the parts in the tester is changing.

Another reason that temperature of the CMOS parts changes during a burst is that signals of different frequencies might be required at different parts of the burst in order to fully test the device under test. To allow these types of tests, commercially available testers allow timing values to be changed "on the fly," which means that the timing values are changed during a burst. Thus, the same timing generator might be programmed to generate edges with a period of 50 nsec during the first half of the burst but then be changed to generate edges with a period of 100 nsec at a different part of the burst. These edge rates represent signals of different frequency and the circuitry, such as formatter 118, would, if made of CMOS, operate at varying frequencies during the burst and thus with varying delays.

Traditional calibration techniques can not address the problem of temperature transients during a burst because they can not be run during a burst. Using a resistive heater controlled in response to a differential delay is not fully effective at addressing this problem. There is a lag between the time when heat generated by the CMOS part changes and the time when the effect of changing the resistance heater is observed. This lag is caused in part by the time it takes for heat generated in the CMOS circuitry to change the temperature of the ring oscillator. The lag is also caused in part by the time it takes for the change in heat generated by the resistive heater to influence the temperature of the CMOS components in the channel circuitry.

There is also a lag when compensation is provided by controlling the supply voltage of elements in the ring oscillator. Though the change in delay is faster than when a heater is used, some time is still required for the heat generated by the CMOS channel circuitry to influence the delay in the ring oscillator.

We have recognized that improved timing accuracy of a CMOS tester could be provided if delays in channel circuitry could be controlled in response to changes in operating frequency with a very fast time constant.

SUMMARY OF THE INVENTION

With the foregoing background in mind, it is an object of the invention to provide a CMOS tester with improved timing accuracy.

It is also an object to provide a CMOS tester with temperature compensation in proportion to the operating frequency in the channel circuitry.

It is also an object to provide a CMOS tester with temperature compensation in each timing path in the channel circuits which is responsive to the frequency of the signals in the channel circuit.

It is also an object to reduce the number of CMOS parts which are subject to signals of varying frequencies in channel circuits of a tester.

The foregoing and other objects are achieved in a CMOS tester having a plurality of channel circuits, each having several timing paths. A frequency controlled delay compensator is included in a portion of the timing paths. As the frequency of the timing signals change and therefore change the temperature in the timing path, the delay compensators adjust the delay in the path and therefore compensate for changes in delay due to temperature.

In a preferred embodiment, the frequency controlled delay compensators are resistive heaters which are cycled on and off. The on cycle time, and hence the amount of heat generated, varies inversely with the frequency of the signal in the timing path.

According to one embodiment, the resistive heaters are selectively located near high power dissipation areas on a chip, such as output pads.

In other embodiments, the resistive heaters are additionally or alternatively selectively located near circuitry which processes signals having a programmable frequency.

According to another feature of the invention, programmable delays in each timing path are generated by breaking the programmed delay into an integer and fractional number of clock pulses. Each clock pulse is delayed by the fractional amount. The integer number of clock pulses are counted separately. The count of the integer number of clock pulses enables a circuit which passes the next clock pulse delayed by the fractional amount. In this way, the frequency of the signals in the circuitry providing the fractional delays is uniform in all channels during a programmed burst.

BRIEF DESCRIPTION OF THE DRAWINGS

The invention will be better understood by reference to the following more detailed description and accompanying drawings in which.

DESCRIPTION OF THE PREFERRED EMBODIMENT

A tester according to the invention may use an overall architecture as depicted in FIG. 1. However, the invention need not be limited to the specific architecture shown.

Test system controller 110 is fabricated using commercially available components, preferably low cost CMOS components, as in the prior art. In a preferred embodiment, test system controller 110 is built around a commercially available general purpose computer.

In contrast to testers widely available in the prior art, each timing generator 116 will be manufactured with low cost CMOS components. Timing accuracy is achieved with the designs presented in greater detail below.

Formatter 118 performs the functions of the formatters in the prior art. Because it processes signals of programmable period (i.e. frequency), its operating temperature might fluctuate during a burst. Nonetheless, it is preferably implemented with CMOS circuitry in conjunction with edge rate compensation circuitry as described below in conjunction with FIG. 4. However, bipolar, BiCMOS or other implementations could also be used for formatter 118, as in the prior art.

Figure 2A:
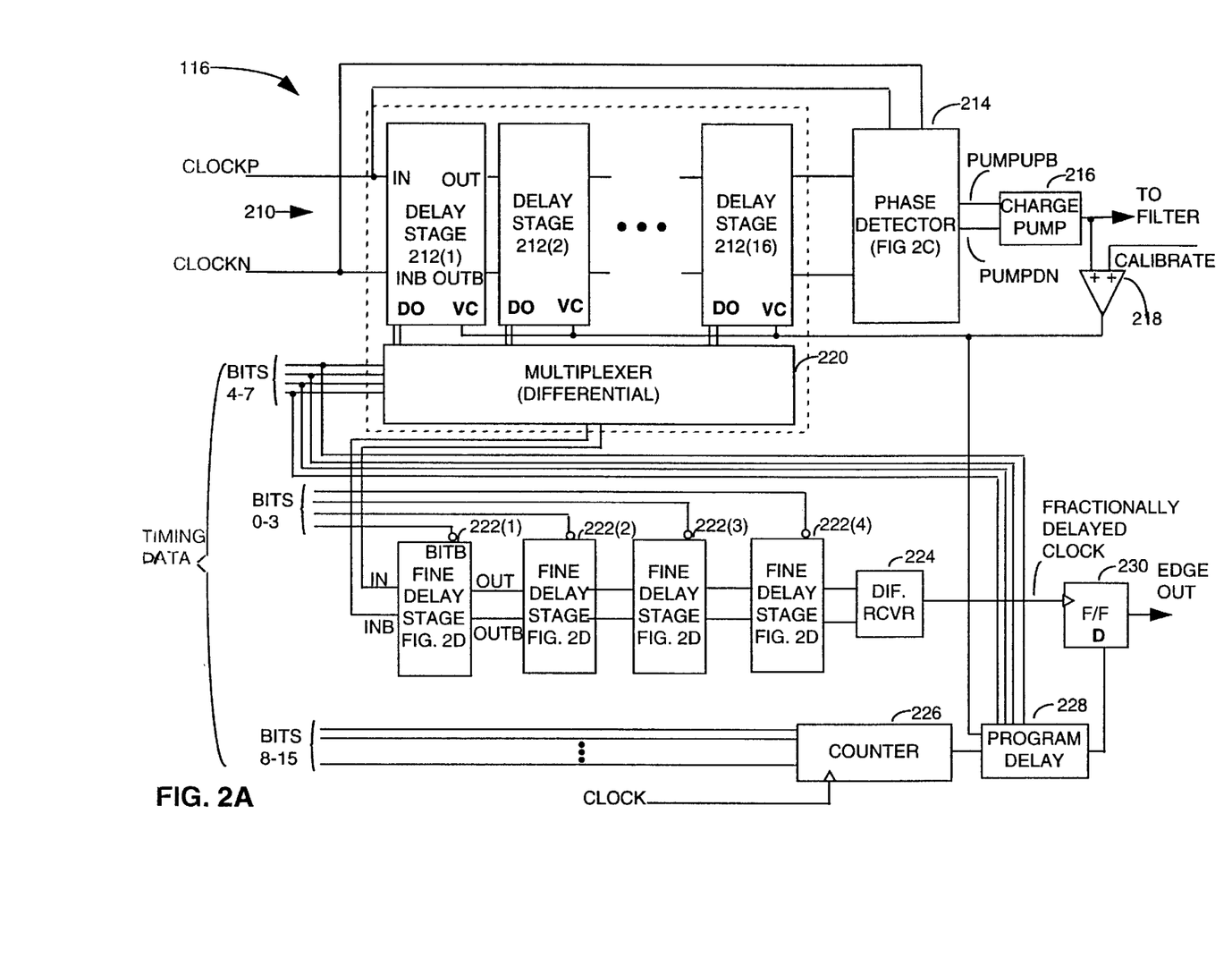
FIG. 2A is a schematic diagram of one timing generator of the tester of FIG. 1.

Turning now to FIG. 2A, a block diagram of one timing generator 116 is shown. The CMOS chip is manufactured with a commercially available process. In a preferred embodiment, several timing generators will be fabricated on a single CMOS chip made by a 0.8 micron process, but the specific process used is not critical to the invention. The chip is designed as a "semi-custom" chip made according to generally accepted design procedures.

A semi-custom chip is designed using computer aided tools and a "cell library." The cell library contains numerous cells, each of which represents a functional element. The cell library includes standard cells such as flip-flops and counters. The computer aided design tools also allow the creation of custom cells by specifying the desired interconnect of transistors or, in some instances, even the layout of structures on the chip. The designer specifies the desired interconnection of the cells and the computer aided tools compile the information into a format which is used by processing equipment in the foundry where the chip is made. Such design tools and methods are well known in the art and are widely available.

Timing generator 116 generates a pulse or timing signal at a time specified by the timing data input signals. The timing data is a digital value specifying a time delay. Once timing generator 116 is enabled, it produces an output signal which is delayed by the specified delay.

It should be noted that FIG. 2A does not explicitly show an enable signal. However, the use of enable signals is well known in the art. For example, test system controller 110 might generate a pulsed signal indicating that a new cycle of the operation of tester 100 is beginning. Such a signal might serve as the enable signal which starts the delay interval provided by timing generator 116.

The timing data input signals are generated by test system controller 110 in a known manner. In some testers, the delay values to be provided by each timing generator are specified as part of the test pattern stored in memory 120. In such testers, the timing information for each of the timing generators 116 might change from one cycle to the next of tester operation in what is termed a change "on the fly." In other testers, the delay provided by each timing generator is stored in a register in advance of a test pattern. There are more timing signals per channel than will be used in any one cycle of the tester operation and each is programmed to generate a timing signal at a different time. These signals make up what is known as a "timing palette." Signals are produced at different times in different cycles of tester operation by selecting a different one of the timing signals for use in the channel during different cycles of tester operation.

It should also be noted that in a tester with many channels there are differences in the propagation time of signals through each of the channels. To keep timing signals in each channel synchronized, a process called "deskewing" is often used. The channels are deskewed by delaying the signal in each channel by an amount which would provide each channel with the same propagation delay. Sometimes, deskewing is performed by increasing the value of the timing data.

The invention can be used with any of these type systems, regardless of how the timing data values are generated. In the embodiment shown in FIG. 2A, the timing data is a digital value having 16 bits. These bits represent the required delay in terms of a number of clock cycles. The timing data has an integer portion and a fractional portion. In the embodiment shown in FIG. 2A, bits 8 to 15 represent the integer portion. Bits 0 through 7 represent the fractional portion.

A timing edge is generated by first producing a fractionally delayed clock signal. The fractionally delayed clock is derived by delaying the reference clock an amount proportional to the value of bits 0 to 7 of the timing data. The integer portion of the timing data is used to produce a gating signal. The gating signal is generated once the integer number of clock periods has passed. The next fractionally delayed clock signal is gated through and is the timing edge output.

An important advantage of this arrangement is that the circuitry which provides the integer delay and the fractional delay are always clocked at the reference clock frequency, regardless of the programmed delay interval. In particular, a delay interval longer than one clock period is often programmed into a tester so that the edges are generated at a rate lower than the reference clock frequency. Even if the timing generator of FIG. 2A generates timing signals at a lower frequency than the reference clock, the circuitry of timing generator 116 operates at the reference clock frequency. Operation at a single clock frequency is important for timing accuracy in CMOS circuitry since the power dissipation, and hence the heat generated, increases with frequency. As the heat generated increases, the delays will change.

Changes in delays due to changes in clock frequency are particularly difficult to account for, even when temperature compensation is used. Temperature compensation circuits necessarily have a finite response time. Thus, if there is a rapid change in heat generated, such as when the operating frequency changes, there will be some interval during which the compensation lags behind the timing changes, therefore producing timing inaccuracies. These inaccuracies are avoided according to the invention by always running the timing generator at the reference clock frequency.

FIG. 2A shows the major cells used to implement timing generator 116. Timing generator 116 includes a delay line 210 made up of individual delay stages 212(1)...212(16), which are described in greater detail in conjunction with FIG. 2B. Timing generator 116 also includes a phase detector 214, which is explained in greater detail in conjunction with FIG. 2C below. The output of phase detector 214 feeds a charge pump 216. The output of charge pump 216 is fed back to each of the delay stages 212(1)...212(16) to adjust the delay of each stage.

These components, delay line 210, phase detector 214 and charge pump 216, implement what is sometimes called a "delay locked loop." The input to the delay locked loop is a reference clock provided by test system controller 110 (FIG. 1). The same reference clock is preferably provided to each timing generator so that the various timing generators can be synchronized. The clock is generated in any known fashion, such as by a crystal oscillator. In preferred embodiments, the clock has a frequency between 20 and 200 MHz, and more preferably about 100 MHz. However, the invention is useful regardless of the frequency of the reference clock.

In a preferred embodiment, the reference clock operates at a fixed frequency. However, the circuit of the invention will operate if the reference clock frequency is variable. The delay lock loop, because it is feedback controlled, will adjust to the clock operating frequency. However, after the clock operating frequency is changed, there is a slight delay for the delay lock loop to adjust to the new clock frequency.

FIG. 2A shows that the reference clock is a differential clock. It is made up of a ClockP and a ClockN signal, which are logical compliments and form one differential signal. Delay line 210 is therefore a differential delay line. Using differential signals and differential circuitry equalizes delays of rising and falling signals.

Delay line 210 is designed to delay the clock-signal by an amount equal to one period of the reference clock signal. Here, delay line 210 contains sixteen delay stages 212. Thus, each delay stage provides a delay of one sixteenth of the period of the clock. As is known in the art, the delay of a CMOS circuit can be increased by increasing the capacitance of the signal path. Many other design techniques for adjusting delay are known. The number of delay stages in the delay line is not critical to thee invention, but is preferably a power of two.

However, because of variability in processing of CMOS chips as well as variation of delays caused by temperature fluctuations, it will not be possible to make a delay stage which always provides the required delay. Rather, each delay stage 212 includes a control input VC. Increasing the voltage on the VC input increases the delay through the delay stage. As shown in FIG. 2A, the VC inputs of delay stages 212(1)...212(16) are connected together and are part of a feedback loop. Thus, feedback is used to ensure that delay line 210 provides a delay of one period of the clock signal.

The feedback signal VC is produced by phase detector 214 and charge pump 216. Phase detector 214 receives as inputs the reference clock signal and the output of delay stage 212(16), which should be delayed by one full period. Phase detector 214 compares the phase of these two signals and produces a pulse on its pumpdn output when the clock is ahead of the delayed clock. This condition indicates that delay line 210 is providing a delay of more than one clock cycle. Phase detector 214 produces a negative going pulse on its pumpupb output when the delayed clock is ahead of the clock. This condition indicates that delay line 210 is providing a delay of less than one clock period.

The pumpupb and pumpdn signals are provided to charge pump 216. Charge pump 216 sources current when there is a pulse on the pumpupb line. It sinks current when there is a pulse on the pumpdn line. The output of charge pump 216 is connected to a low pass filter (not shown), which can be simply implemented with a capacitor. Such a capacitor is preferably external to the chip on which timing generator 116 is implemented because of the space a capacitor takes up on a chip.

Charge pump 216 can be simply implemented, as is known in the art, with transistors acting as switches. The output of charge pump 216 is a signal which increases when the delayed signal is delayed by less than one clock period and decreases when the delayed signal is delayed by more than one clock period. The output of charge pump 216 settles into a steady state condition when delay line 210 provides a delay of exactly one clock period.

As described above, the output of charge pump 216 is used as a feedback signal to adjust the delay of delay line 210. It is fed back through summing amplifier 218. Summing amplifier 218 is optional and is used to add an offset to the feedback signal. The resulting feedback signal is provided as an input to each of the delay stages 212.

The fractionally delayed clock signal is produced by delay line 210, multiplexer 220 and a fine delay line made up of fined delay stages 222(1) to 222(4). Each delay stage 212 of delay line 210 includes an output DO. Because each delay stage delays the clock signal by $1/16$ of a clock period, the successive outputs of delay stages 212(1), 212(2), 212(3), etc. represent the clock signal delay by $1/16$ of a clock period, $2/16$ of a clock period, $3/16$ of a clock period, etc. The DO output of each delay stage is fed as an input to multiplexer 220, which selects one of the delayed clock signals.

The control inputs to multiplexer 220 are bits 4 through 7 of the timing data. These are the upper bits of the fractional part of the delay. These bits specify a coarse delay in units of $1/16$ of a clock period. Thus, by using them to control multiplexer 220, they select a delayed clock signal with the correct coarse delay. It should be noted that the data inputs to multiplexer 220 are successively delayed in increments of $1/16$ of a clock period, starting at $1/16$ and increasing successively to $16/16$ or one full clock period. On the other hand, the upper four bits of the fractional part of the timing data start at 0 and increase successively to $15/16$ of a clock period. Thus, multiplexer 220 always introduces an additional delay of $1/16$ of a clock period beyond what is specified by the timing data. However, as mentioned above, the tester is designed to generate timing signals in each channel with a programmed relative delay. Adding the same fixed delay in each timing generator does not impact the relative delay and does not introduce any inaccuracy.

The clock signal with the selected coarse delay is passed from multiplexer 220 to the input of a fine delay line made up of fine delay stages 222(1) . . . 222(4). Each fine delay stage 222(1) to 222(2) introduces a delay which increases a set amount when its Bit control input is asserted. The amount of delay increase in each stage is different, in what is termed a binary weighted sequence.

Stage 222(4) increases its delay by $1/32$ of a clock period. Stage 222(3) increases its delay by $1/64$ of a clock period. Stage 222(2) increases its delay by $1/128$ of a clock period and stage 222(1) increases its delay by $1/256$ of a clock period. The bit inputs to these stages are routed to bits 3, 2, 1 and 0 of the timing data. The cumulative effect of the delay through fine delay stages 222(1) . . . 222(4) is an increase in delay by the amount specified by the lower order bits of the fractional part of the timing data. There will be some fixed offset introduced. However, as mentioned above, the fixed delay does not impact on the accuracy, because only the relative delays between channels is important.

The output of fine delay stage 222(4) is passed to differential receiver 224. As is known in the art, a differential signal is converted to a single ended signal by a differential receiver. Differential signals are used in both the coarse and fine delay lines. These circuits employ cross coupled feedback to eliminate timing inaccuracies which can occur with single ended CMOS signals. The rise and fall times of the same CMOS element generally differ. By having a differential delay line, each signal transition always causes both a rising and a falling edge. Thus, there is no difference in delay for passing a rising edge versus a falling edge and greater accuracy is achieved. Differential components need not be used for the invention, but can provide better accuracy.

Figure 2B:
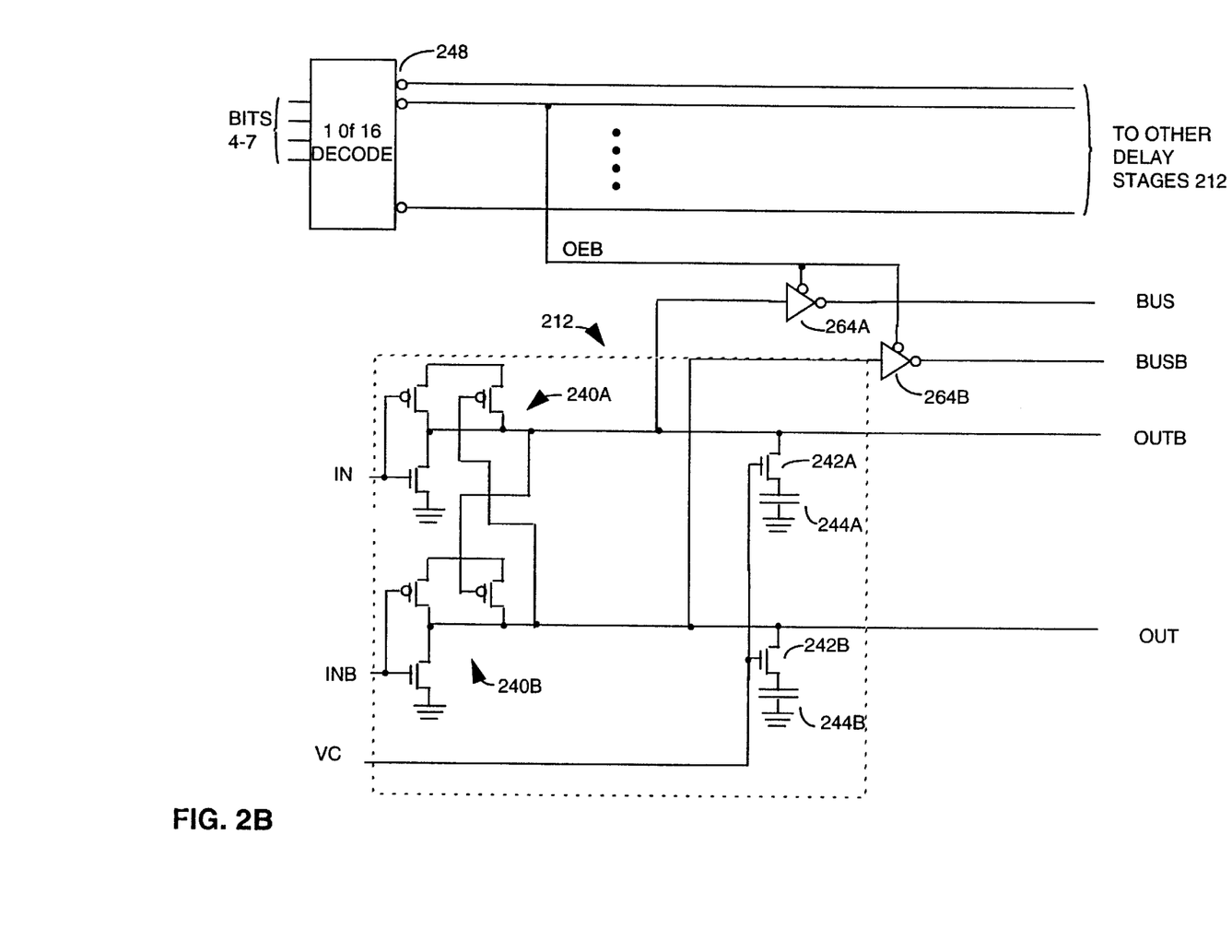
FIG. 2B is a schematic-diagram of one delay stage in FIG. 2A.

The cross coupled feedback is shown in FIG. 2B. Each inverter is traditionally made with a p-channel transistor in series with an n-channel transistor between the supply voltage and ground. The gates of the two transistors are connected together as the input to the inverter. The output is taken at the point of connection between the two transistors. At steady state, one of the transistors will be turned on and one will be turned off. When the input is HI, the n-channel transistor will be on, connecting the output to ground. Conversely, when the input is LO, the p-channel transistor will be on, connecting the output to the supply voltage.

A transition of the input from LO to HI or HI to LO causes a complementary change at the output. Because the conductance in the n-channel is greater than in the p-channel transistor, the output transition is not symmetrical. The output can go from HI to LO faster than it can go from LO to HI.

Cross coupled feedback equalizes these transitions by speeding up the LO to HI transition. To provide cross coupled feed back, an additional p-channel transistor is connected in parallel with the first p-channel transistor. The control input of the second p-channel transistor is connected to the output of a complementary inverter. For example, the second p-channel transistor of inverter 240A is connected to the output of inverter 240B. Because inverters 240A and 240B are complementary, whenever, the output of inverter 240B is going from HI to LO whenever the output of inverter 240A is going from LO to HI.

As mentioned above, the HI to LO transition of inverter 240B tends to be faster than the LO to HI transition of inverter 240A. However, when the output of inverter 240B starts to go LO, the additional p-channel transistor in inverter 240A is turned on. The combined current through the parallel p-channel transistors in inverter 240A thus increases and speeds up the LO to HI transition of inverter 240A. The additional p-channel transistor in inverter 240B similarly speeds up the LO to HI transition of inverter 240B. The transition times are therefore much more equal.

The output of differential receiver 224 is a single ended signal representing the fractionally delayed clock. The fractionally delayed clock is used to clock flip flop 230. Flip flop 230 is a D-type flip flop. When its D input and clock inputs are HI, its output will go high. Thus, the output of flip flop 230 will be synchronized to the fractionally delayed clock. The specific pulse of the fractionally delayed clock selected by flip flop 230 is determined by the output of counter 236 and programmed delay 238. These elements ensure that the pulse of the fractionally delayed clock selected by flip flop 230 is the fractionally delayed pulse which occurs after the required integer number of clock periods has passed. Thus, the selected pulse is delayed by the required integer number of clock pulses and the required fractional part of a clock period.

To ensure selection of the correct pulse of the fractionally delayed pulse, counter 226 is loaded with bits 8 through 15 of the timing data. These bits represent the integer number of clock periods of the required delay. In a preferred embodiment, counter 226 is implemented as a linear feedback shift register type counter. Such counters can operate at a high clock rate with little delay. However, any counter operating at a suitable speed could be used.

Counter 226 is clocked by the reference clock input. Here, the reference clock is shown as a single ended signal. A counter accepting a differential signal could be used. Alternatively, the differential reference clock could be converted to a single ended signal using a differential receiver as described above. It produces an output pulse when the required number of clock periods have passed.

The output pulse from counter 226 is passed to program delay 228. Program delay 228 ensures adequate setup and hold time is provided at the D input of flip flop 230 for all delay values of the fractionally delayed clock.

Programmed delay 228 is an adjustment delay. In the illustrated embodiment, it is a delay line like delay line 210. It is not used to generate a timing value. It is used only to ensure that the output of counter 226 is applied to flip flop 230 with the appropriate setup and hold time around the clock input to flip flop 230 even though the clock input can change under programmed control. Therefore, programmed delay 228 does not need to be as accurate as the delays used to generate fractionally delayed clock. Programmable delay 228 need not, for example, have a VC input to correct for temperature and process variations (though such an input is used in the preferred embodiment so that programmed delay 228 can be the same as delay line 210). Alternatively, programmable delay 228 can be implemented simply as a binary weighted delay line.

In testers in which Timing Data does not change on the fly, programmable delay 228 might not be needed. It is, however, desirable when Timing Data changes on the fly. For example, during the clock period in which Timing Data changes, it is possible that two delayed edges might be selected by multiplexer 220: one corresponding to the old Timing Data value and one corresponding to the new value. If counter 226 were clocked directly by those edges, it would produce an incorrect count. Alternatively, even if the arrangement shown in FIG. 2A, if counter 226 produced its output in the same clock period that two pulses were produced by multiplexer 220, an erroneous edge signal might also be produced.

Flip flop 230 thus produces a pulse at the required time. It is delayed by the specified integer number of clock periods and the specified fractional number of clock periods. FIG. 2A does not explicitly show a reset circuit, but in a preferred embodiment flip flop 230 is reset after one half clock period. Thus, the output of flip flop 230 is a timing pulse. This pulse is passed on to formatter 118 (FIG. 1) and used in the generation of test signals as in the prior art.

Turning now to FIG. 2B, a representative delay stage 212 is shown in greater detail. Each delay stage 212 has an in and an inb input lines. These lines represent a single differential input. Each line is buffered by an inverter, 240A or 240B, respectively. The components used to make inverters 240A and 240B are sized to provide a delay which, taking into account fluctuations in temperature and variations in processing conditions, has a nominal value slightly less than the required delay of the stage. The actual delay is then adjusted with the VC input, which can change the actual amount of the delay preferably at least +/−30%.

The inverters 240A and 240B are, as shown, each implemented with three transistors. The transistors are configured with cross coupled feed back to improve edge symmetry.

The output of inverter 240A becomes outb, the inverted output. The output line has connected to it transistor 24-2A and capacitor 244A. Capacitor 244A can be formed using a transistor with both source and drain tied to ground and the gate input as the second electrode of the capacitor. For the example values used herein, a capacitor having a value of 576FF was used.

The gate or control input of transistor 242A is connected to the VC control input. These components make a resistor-capacitor (RC) path to ground, which slows the propagation time through the delay stage 212. The resistance through transistor 242A varies in proportion to the value of the signal VC. Thus, the value of the RC path and hence the delay in the stage varies in proportion to the value of VC.

The output of inverter 240B is likewise connected to a transistor 242B and capacitor 244B. These components provide a similar delay for the inb signal.

FIG. 2B also shows the implementation of multiplexer 220. Multiplexer 220-is a distributed multiplexer. Each delay stage 212 contains a pair of tri-state buffers 246A and 246B connected to common bus and busb lines, respectively. When enabled, tri-state buffers 264A and 246B pass the delayed signal from stage 212 onto the bus and busb lines.

The enable inputs to tri-state buffers 246A and 246B are tied together and come from one of the output lines of decoder 248. The tri-state buffers 246A and 246B are each tied to a separate line of decoder 248 in order, such that delay stage 212(1) is tied to the 0000 output; delay stage 212(2) is tied to the 0001 output; delay stage 212(3) is tied to the 0010 output; etc.

The inputs of decoder 248 are bits 4–7 of the timing data. In this way, the value on the bus and busb lines represents the clock input signal which is delayed by an amount specified by bits 4–7 of the timing data. The bus and busb lines are the output of multiplexer 220 (FIG. 2A).

Figure 2C:
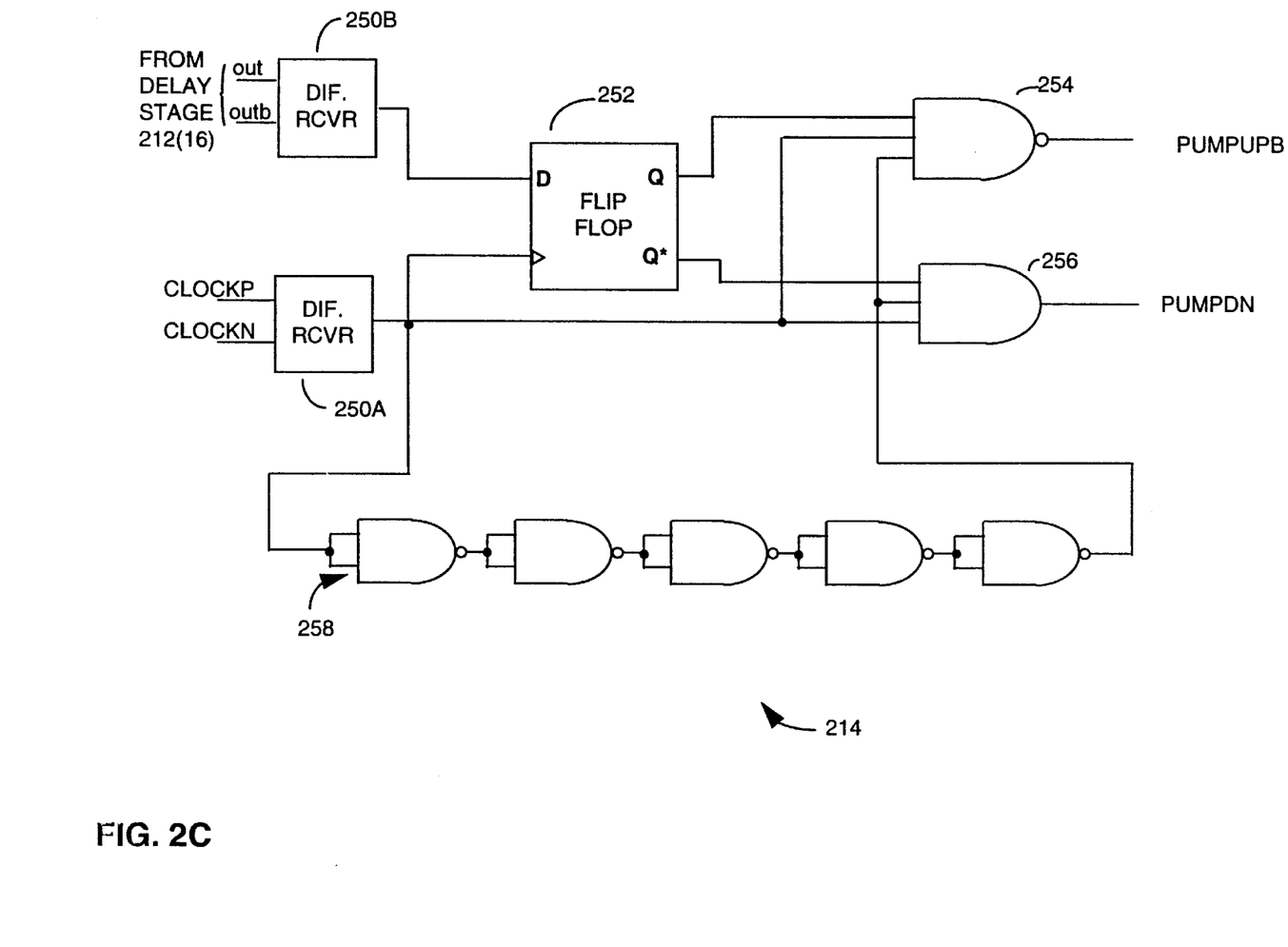
FIG. 2C is a schematic diagram of the phase detector of FIG. 2A.

FIG. 2C shows a schematic of a circuit which could be used to implement phase detector 214. Phase detector 214 contains differential receivers 250A and 250B, which convert the reference clock and the delayed clock, respectively, into single ended signals which are the inputs of the phase detector. The outputs of phase detector 214 are a signal pumpupb and pumpdn. When pumpupb goes low, the output of charge pump 216 (FIG. 2B) will increase. When pumpdn goes high, the output of charge pump 216 will decrease.

Phase detector 214 includes flip flop 252 which is clocked by the reference clock. The D input of flip flop 252 is connected to the output of the last delay stage of delay line 210. When delay line 210 provides a delay of more than one clock period, the reference clock signal will go HI before the delayed clock signal. Thus, when flip flop 252 is clocked, the D input will be LO and the Q* output will be HI. pumpdn will go HI as long as the other inputs to AND gate 256 are also HI.

The other two inputs to AND gate 256 are derived from the reference clock directly and a delayed version of the reference clock produced by inverting delay line 258. In FIG. 2C inverting delay line is shown to be implemented with five NAND gates wired in series.

When the reference clock goes from LO to HI, the output of inverting delay line will, after a delay go from HI to LO. During the period of delay, though, both the clock and the clock delayed through inverting delay line 258 will both be HI.

Thus, for a period of time all inputs to AND 256 will be HI, and the pumpdn output will be HI. This output will go low again, though, once the HI reference clock signal propagates through inverting delay line 258, sending pumpdn LO. Thus, when the phase of the reference clock is ahead of the delayed clock, the pumpdn signal is pulsed HI. The length of the pulse is determined by the length of delay in inverting delay line 258. For the example values given here, the length of the pulse is between 2 and 3 nsec.

A negative going pulse is similarly produced at the pumpupb output whenever the phase of the reference clock is behind the phase of the delayed clock signal. In that case, the Q output of flip-flop 252 goes HI such that all inputs to NAND gate 254 are temporarily HI.

In this way, phase detector 214 produces control signal for charge pump 216 which adjust the control voltage VC to equalize the phase of reference clock and the delayed clock signal out of delay stage 212(16).

Figure 2D:
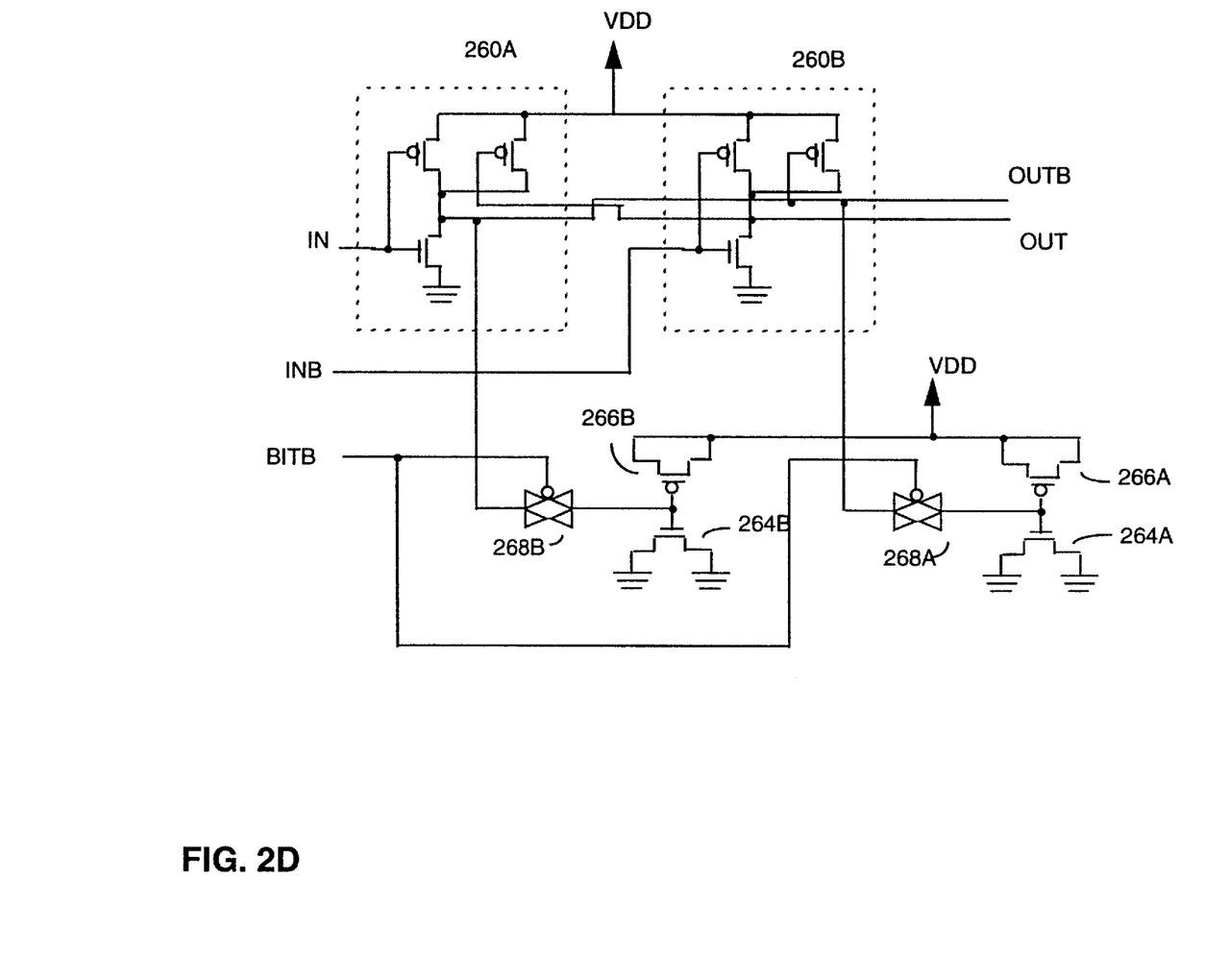
FIG. 2D is a schematic diagram of one fine delay stage in FIG. 2A.

FIG. 2D shows a fine delay stage 222. Fine delay stage 222 is a differential delay stage and therefore has two identical signal paths from in to outb and from inb to out. Considering only the path from in to outb, the input signal is first buffered by inverter 260A. The output of inverter 260A is the outb signal.

The output of inverter 260A is coupled to capacitors 264A and 266A through transfer gate 268A. Capacitor 264A is connected to ground and capacitor 266A is connected to the supply voltage. When transfer gate 268A is turned on, or opened, by the BITb signal, capacitors 264A and 266B will load the output of inverter 260A, thereby increasing the delay.

The signal path from inb to out includes identical elements so that the in and inb signals are delayed the same amount.

The amount the delay in the fine delay stage 222 increases when the BITb line is LO depends on the size of capacitors 264A, 264B, 266A and 266B. The size of capacitors 264 and 266 in each stage 222(1) . . . 222(4) is different. The size of the capacitor is chosen to provide the binary weightings of delay as described above. In the example of FIG. 2A those delays correspond to $\frac{1}{256}$, $\frac{1}{128}$, $\frac{1}{64}$ and $\frac{1}{32}$ of a clock period.

Thus, each fine delay stage 222 provides a delay which increases in response to the BIT signals, which are derived from the timing data as shown in FIG. 2A.

Figure 3:
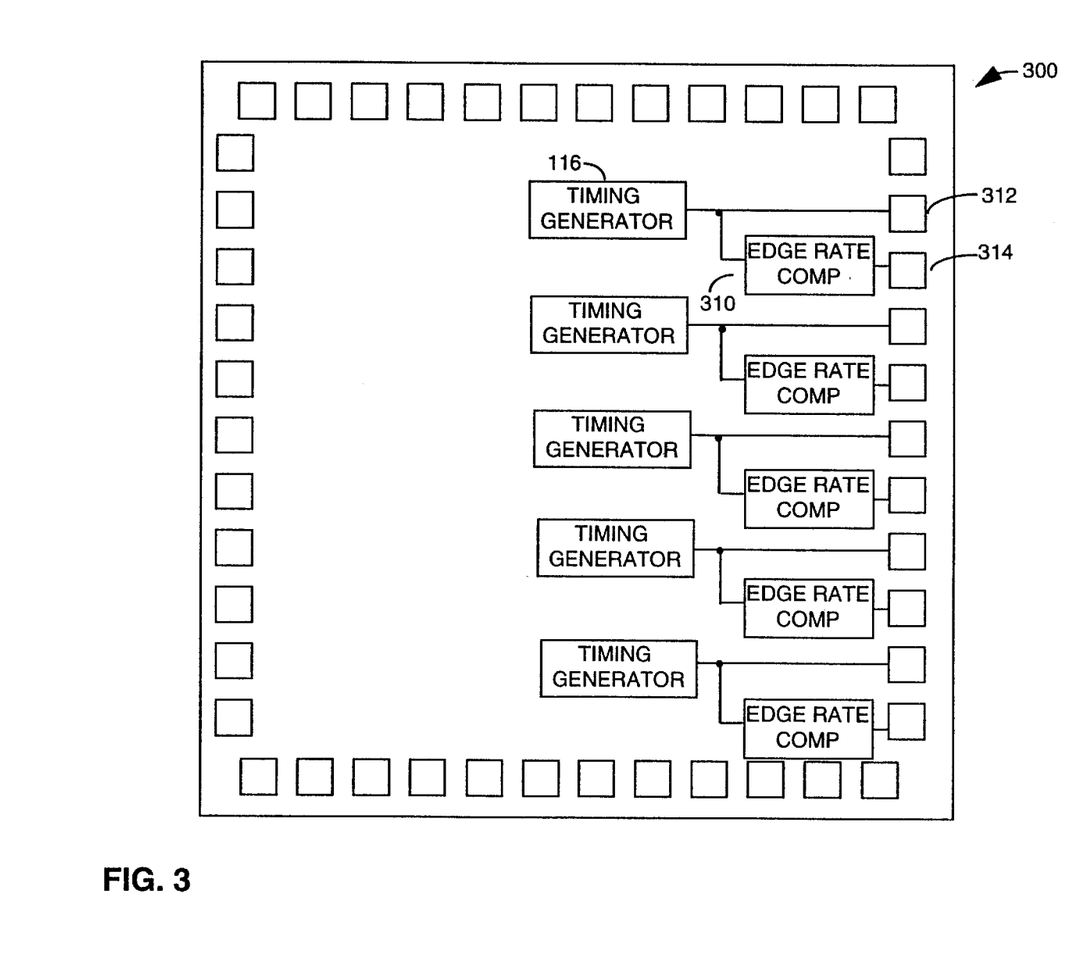
FIG. 3 is a schematic diagram showing the placement of circuitry of the invention in relation to bonding pads on a chip.

Turning now to FIG. 3, an additional feature of the invention is shown. The compensation circuitry as described above is useful for compensating for changes in average temperature and processing variations. Greater accuracy can be obtained by anticipating and adjusting to changes in operating temperature based on changes in operating frequency.

FIG. 3 shows, in a schematic format, a CMOS chip 300 on which several timing generators 116 are implemented. The number of timing generators on each chip 300 is a matter of design choice and will be dictated by considerations such as the number of input/output pins or other factors.

A plurality of edge rate compensators 310 are used. Each edge rate compensator 310 controls a heat generating circuit element in response to the frequency of its input signal. As the frequency of the input signal increases, the amount of heat generated by the edge rate compensator decreases. Thus, as the heat generated by the circuitry processing the timing signal increases, the heat generated by the edge rate compensator decreases. In this way, the overall temperature of chip 300 stays constant in response to changes in operating frequency.

FIG. 3 shows that the output of each timing generator 116 runs to an output pad 312. Output pads of a CMOS chip operate at relatively high power levels. Even when relatively low voltage output pads, such as those with a one volt swing, are used, a relatively high percentage of the total change in heat generation with frequency will be due to changes in the heat generated by output pads 312. Thus, FIG. 3 shows that edge rate compensators 310 are used only in conjunction with signals provided to output pads 312.

Each timing generator 116 has associated with it an edge rate compensator 310. The timing signal, or "edge" from timing generator 116 is also provided as an input to edge rate compensator 310. The output of edge rate compensator 310 runs to a dummy output pad 314. The dummy output pad 314 can be the same as output pad 312 used to carry an edge. However, its only purpose is to generate a variable amount of heat and the signal on dummy output pad 314 is not otherwise used in tester 100 (FIG. 1).

The configuration shown in FIG. 3 has the advantage of not requiring changes to the design of the output pads, which are implemented using standard I/O cells. However, it has the disadvantage of requiring extra output pads be used. In some instances, the amount of circuitry which can be placed on a single chip is limited by the number of available output pads. In those circumstances, it might not be desirable to use a separate output pad as a dummy output pad solely to generate heat.

Instead, heat generating elements might be incorporated into each output pad 312. Alternatively, other circuit elements which generate heat might be added to chip 300 near each output pad 312. A simple way to generate heat is with any logic gate or collection of gates having a relatively large drain resistance. When the gate is turned on, the $I^2R$ heat generated in the drain resistance will increase and when the gate is turned off the generated heat will decrease.

Also, it should be appreciated that FIG. 3 shows that edge rate compensators 310 are used only near output pads 312. Edge rate compensators could be used in conjunction with any other circuit element which generates a significant amount of heat. When used with other circuit elements, a separate heating element will be required. Preferably, the heating element is placed within 200 microns of those circuit elements.

Edge rate compensators might also be used additionally or alternatively only in conjunction with circuit elements which process signals of varying frequency, such as formatters 118. In particular, edge rate compensators are very useful in testers which allow Timing Data to change "on the fly," because such testers necessarily include circuitry that processes signals which could change in frequency during a burst.

Figure 4:
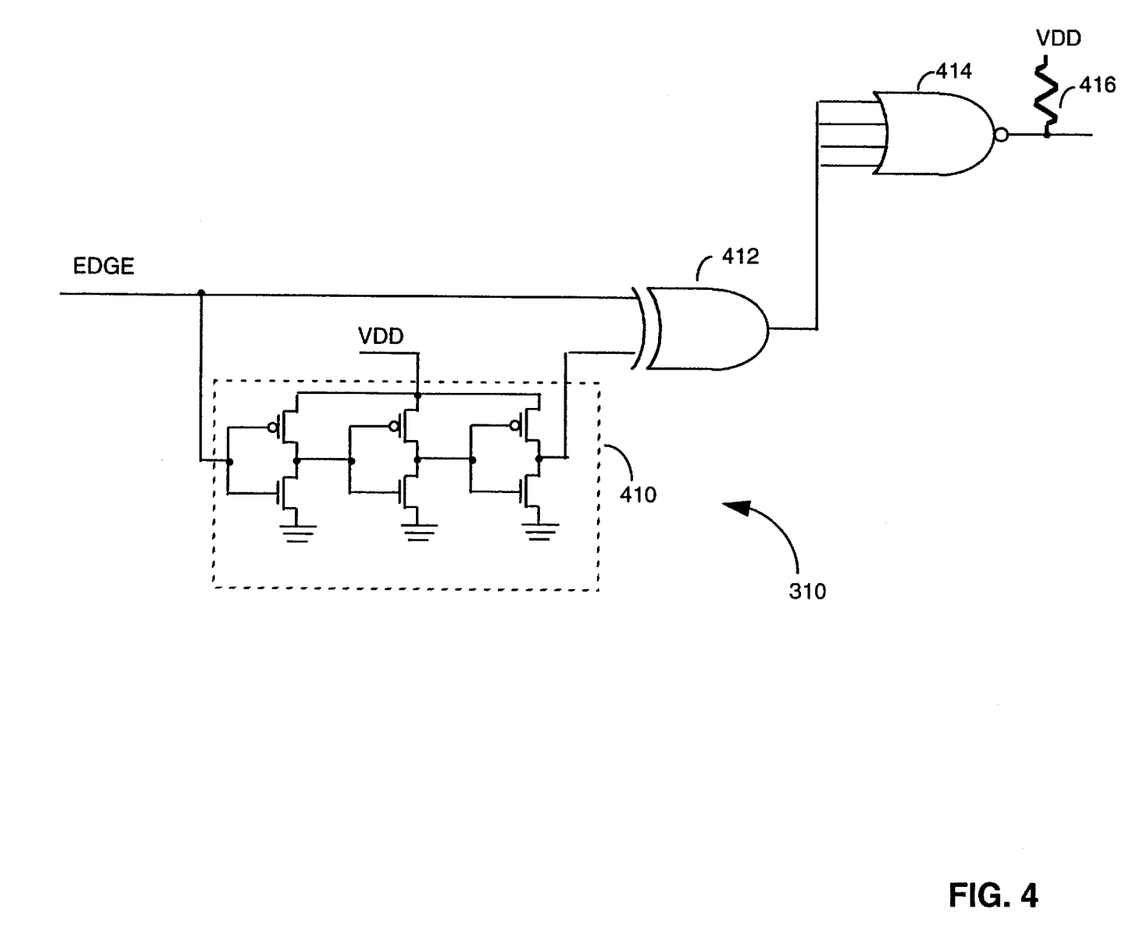
FIG. 4 is a schematic diagram of a preferred embodiment of the edge rate compensator of the invention.

Turning now to FIG. 4, a schematic of a circuit which can be used to implement edge rate compensator 310 is shown. The edge input signal is applied as one input to exclusive-or gate 412. The edge signal is also applied to the second input of exclusive-or gate through inverting delay element 410.

At steady state, the output of exclusive-or gate 412 will be HI. However, whenever the edge signal changes, the output of exclusive-or gate will go LO for a length of time equal to the delay through inverting delay line 410.

The output of exclusive-or gate 412 ifs the input to NOR gate 414. In the circuit of FIG. 4, NOR gate 414 represents a heating element. As long as the output of exclusive-or gate 412 stays HI, there will be current sunk by NOR gate 414, generating heat in resistor 414 and in NOR gate 414. However, when the output of exclusive-or gate 412 goes LO, there will be virtually no current sunk by NOR gate 414 and therefore virtually no heat generated by resistor 416.

As the frequency of the edge signal increases, the amount of time the output of exclusive-OR gate is LO will increase. Thus, the amount of heat generated in resistor 416 will vary inversely in proportion to the frequency of the edge signal. The proportionality constant will depend in part on the delay introduced by inverting delay element 410. Longer delays increase the proportionality constant.

The exact value of the delay required in inverting delay element 410 will depend on many factors and may be best determined empirically. In the embodiment of FIG. 4, the delay of delay element 410 is equal to the delay through three inverting stages.

In the embodiment of FIG. 4, the heat generating element is shown as resistor 416 and NOR gate 414. The heat generating elements are shown near the other elements of edge rate compensation circuit 310. However, the physical location is chosen only for ease of illustration. It is preferable that the elements generating the heat, resistor 416 in this case, be located as close as possible to the circuit elements which will be generating heat in direct proportion to the frequency of the edge signal. Where the entire edge rate compensation circuit can not be placed in close proximity to the other elements, the heat generating element can be separated from the other circuit elements shown in FIG. 4.

FIG. 4 shows that the heat generating element is a resistor 416. A resistor may be implemented in a CMOS chip by transistors in which the gate is connected to the drain. Alternatively, since all circuit elements have resistance, it will not in all cases be necessary that resistor 416 be a separately identifiable element. The inherent resistance of some other circuit element may serve the same purpose. For example, in FIG. 3, the inherent resistance of dummy pads 314 provides the resistance illustrated by resistor 416.

FIG. 4 shows NOR gate 414 wired with all of its inputs connected together. NOR gate 414 is thus acting as a simple inverter. FIG. 4 shows that a multi-input NOR gate is used because such a circuit will sink more current than a simple, standard cell inverter. However, an inverter with a large current sink capacity or other circuit element which sinks current in response to a control input could be used as well.

It was described above that the amount of heat generated by edge rate compensator 310 is inversely proportional to the frequency of edge signal. The proportionality constant is influenced by the length of delay introduced by delay element 410. It is also influenced by the amount of current sunk by NOR gate 414 and also the size of resistor 416. Any or all of these values can be adjusted to provide the desired heat which varies inversely with frequency to counter balance heat which varies directly with frequency.

Even though it will be desirable in some cases to increase the heat generated by edge rate compensator 310, sink current can not be increased arbitrarily. It might be necessary to use resistors external to chip 300 or to use a current limited supply to keep the sink current below an acceptable level, such, as 25 mA.

Having described one embodiment, numerous alternative embodiments or variations might be made. For example, the number of bits in the timing data serves as an illustration. Any number of bits might be used. When the number of bits is changed, the range of counter 226, the length of delay line 210 and the length of the fine delay line should be changed accordingly.

Other variations to the described circuit might be made. For example, FIG. 2A shows only one counter 226 per timing generator. Multiple counters 226 might be used so that multiple edge signals could be generated at spacings less than the number of clock cycles programmed into counter 226.

Also, summing amplifier 218 is shown as optionally adding an offset to the VC signal. The closed loop manner in which the VC signal is generated ensures that it will eventually settle into its required value. However, adding a calibration signal can reduce the required dynamic range of the output of charge pump 216.

Also, it should be noted that FIG. 2A shows that the circuitry which produces fractionally delayed clock always operates at the frequency of the reference clock regardless of the value of the timing data. This is in contrast to a conventional arrangement in which the output of counter 226 is delayed by the fractional amount. Such an arrangement reduces the variation in propagation delay through the fractional delay circuit which would be caused by changes in operating frequency when the value programmed into counter 226 changes. However, the conventional method of generating fractional delay could also be used with other elements of the invention. For example, if the fractional delay circuitry were edge rate dependent, an edge rate compensation circuit as shown in FIG. 4 could be used with the fractional delay circuit.

In a preferred embodiment, the reference clock will, during the entire time that tester 100 is operating, be applied to the fractional delay circuitry of FIG. 2A. Even though the fractionally delayed clock signal is always generated, no edge signal is generated unless counter 226 is enabled. This will ensure that the circuitry used to generate accurate timing signals will be at a thermal equilibrium condition at the start of a pattern burst. This arrangement provides greater timing accuracy, but other benefits of the invention might be obtained without this feature.

Greater timing accuracy is also provided in the above described embodiment through the use of differential circuit elements with cross coupled feed back to implement the fractional delay circuitry. Single ended circuitry might be used instead if the additional timing accuracy is not required.

Also, it should be appreciated that the prior art tester architecture shown in FIG. 1 is merely an illustration. The invention might be used for the accurate generation of timing signals using low cost circuitry in a tester of any architecture. The same circuitry might also be used in other applications where Low cost generation of accurate, programmable timing signals is required.

As an example of another variation, FIG. 2A shows that counter 226 is clocked by the reference clock and then an alignment delay is used to position the output pulse of counter 226 for sampling by the fractionally delayed clock. The fractionally delayed clock could be used as the clock input to counter 226. In that case the output pulse of counter 226 would be the edge output signal of timing generator 116. However, the embodiment of FIG. 2A is preferred because the timing of the edge signal is more predictable, particularly if the Timing Data changes on the fly.

FIG. 2A also shows that programmable delay 228 has timing inputs which are the same as the inputs to multiplexer 220. The timing inputs might be generated separately for each of these circuits to allow greater flexibility in operation.

Also, it was described that edge rate compensation circuit 310 operates in essentially an open loop fashion. The heat generated in the compensation circuit is proportional to frequency of the input signal and the proportionality constant is fixed by the circuit elements used. The proportionality constant might be varied with feedback to provide closed loop control in response to changes in frequency.

As another example of a variation, it is shown that fine delay stages 222 are not adjusted based on the VC signal. Such adjustments might be made for greater accuracy.

In conjunction with FIG. 4, it is noted that generated heat is changed in response to changes in the frequency of signals. The change in heat generated by the edge rate compensator is localized to avoid changed in propagation delay in circuitry near that circuit elements processing the varying frequency signals. It should be noted that temperature is used to indirectly control delay. Other methods to control delay might also be used in an edge rate compensator. For example, an edge rate compensator might produce a control signal like the VC signal, which would then be provided as a control input, or combined with other control inputs, to the circuitry located around the edge rate compensator to control delay directly.

Therefore, the invention should be limited only by the spirit and scope of the appended claims.

What is claimed is:

1. Automatic test apparatus having circuitry fabricated on an integrated circuit chip of the type having at least one power path, the integrated circuit chip comprising:
   a) a first circuit producing a timing signal;
   b) a signal path, coupled to the first circuit, on the integrated circuit chip carrying the timing signal;
   c) a power path on the integrated circuit chip; and
   d) an edge rate compensation circuit having an input connected to the signal path, comprising:
      i) a resistive element having a first connection point and a second connection point, the first connection point being connected to the power path; and
      ii) a switching circuit having an input connected to the input of the edge rate compensation circuit and an output connected to the second connection point of the resistive element, the switching circuit passing current in an amount inversely proportional to the frequency of the signal at its input;

e) wherein the integrated circuit chip is fabricated of a material that transmits heat from the resistive element to the first circuit.

2. The automatic test apparatus of claim 1 wherein the switching circuit of the edge rate compensation circuit comprises:
   a) a logic gate having a control input and a current sinking input connected to the second connection point of the resistive element, the logic gate sinking current in response to a first logic level signal at its control input;
   b) a logic circuit, having an input connected to the input of the switching circuit and an output connected to the control input of the logic gate, which produces the first logic level signal for a predetermined time following a transition of the signal at its input.

3. The automatic test apparatus of claim 2 wherein the logic circuit comprises:
   a) a second logic circuit having first and second inputs and an output, the output being the output of the logic circuit, said logic gate producing a first logic level signal when the signals at the first input and the second input have different logic values;
   b) a connection between the input of the logic circuit and a first input of the second logic circuit; and
   c) a delay element connected between the input of the logic circuit and the second input of the second logic circuit.

4. The automatic test apparatus of claim 3 wherein the second logic circuit comprises an exclusive OR gate.

5. The automatic test apparatus of claim 1 wherein the resistive element comprises a resistor.

6. The automatic test apparatus of claim 1 wherein the integrated circuit chip has I/O pads and the resistive element comprises-circuitry within an I/O pad.

7. The automatic test apparatus of claim 1 wherein the integrated circuit chip has an I/O pad and the timing signal is connected to the I/O pad and the resistive element is within 200 microns of the I/O pad.

8. The automatic test apparatus of claim 1 additionally comprising:
   a) a plurality of signal paths, each carrying one of the plurality of timing signals; and
   b) a plurality of edge rate compensation circuits, each connected to one of the signal paths.

9. Automatic test apparatus of the type generating a plurality of timing signals with a timing generator in which the frequency of the timing signal can be varied by a control program for the automatic test apparatus, comprising:
   a) a semiconductor circuit passing said timing signal, the semiconductor circuit introducing a delay in the timing signal; and
   b) a feed forward compensation circuit, having an input connected to the timing signal and an output that varies in response to the frequency of the timing signal, the feed forward compensation circuit including thermal means disposed proximate the semiconductor circuit for adjusting the delay in response to the output.

10. The automatic test apparatus of claim 9 wherein the timing generator is on an integrated circuit chip and additionally comprising a second circuit on the integrated circuit chip adjacent the semiconductor circuit and wherein said thermal means also comprises means for compensating the delay through the second circuit in response to the output.

11. The automatic test apparatus of claim 10 wherein said thermal means comprises a means for generating heat inversely proportional to the frequency of the timing signal.

12. The automatic test apparatus of claim 11 wherein the integrated circuit chip is a CMOS chip.

13. The automatic test apparatus of claim 9 wherein said thermal means comprises a means for generating heat inversely proportional to the frequency of the timing signal.

14. The apparatus of claim 9 additionally comprising a reference clock and wherein the timing generator comprises:
   a) a programmable delay line having an output and an input connected to the reference clock and a control input, the delay line producing on its output a delayed version of the reference clock signal with the amount of the delay being controlled by the control input;
   b) a counter, operating at the reference clock frequency, having an output and a clock input coupled to the reference clock signal and a control input, the counter asserting a signal at its output after counting the number of periods of the clock input specified by the control input; and
   c) gating circuitry having an output, a first input connected to the output of the programmable delay line and a second input connected to the output of the counter, the gating circuitry gating through to its output the next pulse at its first input when the signal at its second input is asserted.

15. The apparatus of claim 14 wherein the test apparatus executes a test pattern in a burst and the programmed frequency of the timing signal can be changed during a burst.

16. The apparatus of claim 14 wherein the timing signals are generated at independently programmed frequencies.

17. The apparatus of claim 14 wherein the programmable delay line comprises a delay line having a plurality of taps and a means for selecting the output of one of the taps in response to a first set of timing control bits.

18. The apparatus of claim 17 additionally comprising a second programmable delay having an input, an output and a control input, the second programmable delay being connected between the counter and the gating circuitry with its input connected to the output of the output of the counter and its output connected to the second input of the gating circuitry and its control inputs being connected to the first set of bits controlling the means for selecting a tap of the delay line.

19. The apparatus of claim 14 wherein the counter is directly connected directly to the reference clock signal.

20. The apparatus of claim 14 wherein the clock input of the counter is connected to a delayed version of the reference clock signal.

21. The apparatus of claim 14 wherein the programmable delay lines includes a delay locked loop.

22. The apparatus of claim 14 wherein the programmable delay line comprises a plurality of stages of differential circuitry.

23. The apparatus of claim 21 wherein differential stages are configured with cross-couple feedback.

24. The apparatus of claim 14 additionally comprising control means, coupled to the control input of the programmable delay line, the control means for generating control inputs to the delay line in response to a program specifying a required frequency.

25. The apparatus of claim 14 wherein the gating circuitry comprises a second programmable delay having an input an output and a control input, the second programmable delay being connected between the counter and the gating circuitry with its input connected to the output of the output of the counter and its output connected to the second input of the gating circuitry.

* * * * *